United States Patent
Ohnishi et al.

(10) Patent No.: US 6,750,503 B2
(45) Date of Patent: Jun. 15, 2004

(54) STACKED GATE ELECTRODE FOR A MOS TRANSISTOR OF A SEMICONDUCTOR DEVICE

(75) Inventors: Kazuhiro Ohnishi, Kodaira (JP); Naoki Yamamoto, Kawaguchi (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 09/829,969

(22) Filed: Apr. 11, 2001

(65) Prior Publication Data

US 2001/0030342 A1 Oct. 18, 2001

(30) Foreign Application Priority Data

Apr. 14, 2001 (JP) .................................... 2000-118491

(51) Int. Cl.[7] ............................................ H01L 29/788
(52) U.S. Cl. .................. 257/315; 257/412; 257/413; 257/751
(58) Field of Search ............................ 257/412, 413, 257/751, 757; 438/197, 585, 592, 765

(56) References Cited

U.S. PATENT DOCUMENTS

| | | | |
|---|---|---|---|
| 6,265,297 B1 | * | 7/2001 | Powell .................. 438/197 |
| 6,291,868 B1 | * | 9/2001 | Weimer et al. .......... 257/413 |
| 6,306,743 B1 | | 10/2001 | Lee |
| 2002/0008294 A1 | | 1/2002 | Hayashi et al. |

* cited by examiner

*Primary Examiner*—David Nelms
*Assistant Examiner*—Mai-Huong Tran
(74) *Attorney, Agent, or Firm*—Antonelli, Terry, Stout & Kraus, LLP

(57) ABSTRACT

A semiconductor device with an MOS transistor gate electrode in a stacked structure comprising a silicon layer, a metal silicide layer, a reaction barrier layer such as a metal nitride layer and a metallic layer formed from the bottom upwards has an increased circuit performance owing to a gate resistance-reducing effect.

24 Claims, 7 Drawing Sheets

STACKED GATE ELECTRODE FOR A MOS TRANSISTOR OF A SEMICONDUCTOR DEVICE

BACKGROUND OF THE INVENTION

The present invention relates to a semiconductor device and a process for producing the same, and more particularly to a semiconductor device with an MIS type transistor and a process for producing the same.

To attain higher performance and higher integration of devices, semiconductor devices have been progressively scaled down over the years, necessitating incorporation of low-resistance materials into the electrode materials. It is thus desirable to incorporate a metal also into the MOS transistor gate electrode.

In case of high speed CMOS devices, on the other hand, low threshold voltage and low gate resistance alone are not enough to attain both higher performance and higher integration. It is also required to reduce the gate/contact pitch. Conventional technologies of satisfying these requirements include a SALICIDE technology of self-aligned silicidation of gate polycrystalline silicon and source/drain regions, a technology using POLICIDE structure, i.e. using a gate of polycrystalline silicon/silicide-stacked structure, a technology using a gate electrode of polycrystalline silicon/high melting point metal-stacked structure, etc.

However, the SALICIDE technology is difficult to use together with a self-aligned contact technology and thus is difficult to reduce the layout pitch. The POLICIDE structure is so high in the sheet resistance that it is difficult to obtain a sufficiently low gate resistance. This is a problem of the POLICIDE structure. Thus, the desirable gate electrode structure capable of satisfying the aforementioned requirements is a metal/polycrystalline silicon-stacked structure.

However, such a stacked structure has a low thermal stability and even if tungsten, i.e. high melting point metal, is used as the metal, reaction takes place between the metal and silicon during the heat treatment at about 650° C., resulting in an increase in resistance, degradation of layer surface state, dielectric breakdown, etc, which are examples of other problems arising. To solve these problems, a structure of inserting a metal nitride layer as a reaction barrier between the metal and the polycrystalline silicon (metal/reaction barrier/polycrystalline silicon-stacked structure) has been proposed (e.g. '98 IEDM Technical Digest, pp. 397–400).

Use of the tungsten nitride layer as a reaction barrier as mentioned above, still suffers from the following problems:

(1) Contact resistance between tungsten nitride and polycrystalline silicon is very high, e.g. up to $2 \times 10^{-5} \Omega\text{-cm}^2$.

(2) Device circuit performance is not improved due to the high contact resistance, etc.

BRIEF SUMMARY OF THE INVENTION

An object of the present invention is to provide a semiconductor device with reduced contact resistance between the reaction barrier layer and the polycrystalline silicon in the metal/reactionbarrier/polycrystalline silicon-stacked structure, and a process for producing the same.

The present invention provides a semiconductor device with an MOS transistor, wherein the gate electrode of the MOS transistor is in a stacked structure comprising a silicon layer, a metal silicide layer, a reaction barrier layer such as a metal nitride layer and a metallic layer formed in this order from the bottom upwards.

The present invention also provides a process for producing a semiconductor device, which comprises a step of forming a first insulation layer on the surface of a semiconductor substrate, a step of depositing a silicon layer, on the first insulation layer, a step of depositing a first metallic layer on the silicon layer, a step of depositing a reaction barrier layer such as a metal nitride layer on the first metallic layer, a step of depositing a second metallic layer on the metal nitride layer, a step of processing the stacked structure comprising the silicon layer, the first metallic layer, the metal nitride layer and the second metallic layer into a gate electrode form, a step of ion implanting an impurity onto the surface of the semiconductor substrate, using the gate electrode as a mask, and a step of reacting the first metallic layer with the silicon layer by heat treatment, thereby forming a metal silicide layer.

Figure 1A:
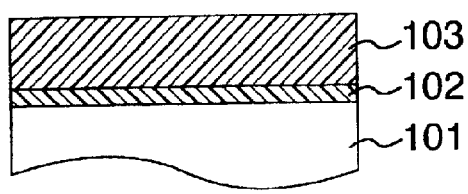
FIGS. 1A to 1E are cross-sectional views showing process steps of Example 1 according to the present invention.

In the drawings, reference numerals have the following meanings:

101 and 301: semiconductor substrate, 102 and 310: gate oxide layer, 103: polycrystalline silicon layer, 104 and 309: metallic layer, 105 and 308: metal nitride layer, 106 and 307: metallic layer, 107 and 306: silicon oxide layer, 108 and 320: metal silicide layer, 109: metal silicide layer, 302: silicon oxide layer, 303 and 305: silicon nitride layer, 304: silicon oxide layer, 311: n-type polycrystalline silicon layer, 312: p-type polycrystalline silicon layer, 313: silicon oxide layer, 315 and 317: punch-through stopper, 314 and 316: diffusion layer, and 318 and 319: deep diffusion layer.

DETAILED DESCRIPTION OF THE INVENTION

To reduce the contact resistance between reaction barrier film and polycrystalline silicon, a metal/reaction barrier/metal silicide/polycrystalline silicon-stacked structure is applied to the present semiconductor device as a gate electrode.

Specific modes of the present semiconductor device and the present process for producing the same are as follows:

(1) A semiconductor device with an MOS transistor, wherein the gate electrode of the MOS transistor is provided as a stacked structure comprising a silicon layer, a metal silicide layer, a reaction barrier layer such as a metal nitride layer and a metallic layer formed in this order from the bottom upwards.

(2) A semiconductor device according to item (1), wherein the silicon layer is doped with an impurity of any desired conductivity type.

(3) A semiconductor device according to item (1), wherein the metal silicide layer has a thickness of 5–20 nm.

(4) A semiconductor device according to item (1), wherein metal silicide layer is a tungsten silicide layer, the metal nitride layer is a tungsten nitride layer, and the metallic layer is a tungsten layer.

(5) A semiconductor device with an MOS transistor whose gate electrode is provided as a stacked structure comprising a silicon layer and a metallic layers as an uppermost layer thereof, provided above on the silicon layer, wherein a metal silicide layer is provided on the silicon layer side and a reaction barrier layer such as a metal nitride layer is provided under the metallic layer side between the silicon layer and the metallic layer.

(6) A semiconductor device according to item (5), wherein the silicon layer is doped with an impurity of any desired conductivity type.

(7) A semiconductor device according to item (5), wherein the metal silicide layer has a thickness of 5–20 nm.

(8) A semiconductor device according to item (5), wherein the metal silicide layer is a tungsten silicide layer, the metal nitride layer is a tungsten nitride layer and the metallic layer is a tungsten layer.

(9) A process for producing a semiconductor device, which comprises a step of forming a first insulation layer on the surface of a semiconductor substrate, a step of depositing a silicon layer on the first insulation layer, a step of depositing a first metallic layer on the silicon layer, a step of depositing a reaction barrier layer such as a metal nitride layer on the first metallic layer, a step of depositing a second metallic layer on the metal nitride layer, a step of processing a stacked structure of the silicon layer, the first metallic layer, the metal nitride layer and the second metallic layer into a gate electrode form, a step of ion implanting an impurity onto the surface of the semiconductor substrate, using the gate electrode as a mask, and a step of reacting the first metallic layer with the silicon layer by heat treatment, thereby forming a metal silicide layer.

(10) A process according to item (9), wherein in the last step the heat treatment is carried out at 650° C. or higher, preferably up to 1100° C.

(11) A process according to item (9), wherein the metal silicide layer is a tungsten silicide layer, the metal nitride layer is a tungsten nitride layer and the first and second metallic layers are tungsten layers.

(12) A process for producing a semiconductor device; which comprises a first step of forming a first insulation layer on the surface of a semiconductor substrate, a second step of depositing a silicon layer on the first insulation layer, a third step of depositing a first metallic layer on the silicon layer, a fourth step of depositing a reaction barrier layer such as a metal nitride layer on the first metallic layer, a fifth step of depositing a second metallic layer on the metal nitride layer, a sixth step of reacting the first metallic layer with the silicon layer by heat treatment, thereby forming a metal silicide layer, a seventh step of processing the stacked structure comprising the silicon layer, the metal silicide layer, the metal nitride layer and the second metallic layer into a gate electrode form, and an eighth step of ion implanting an impurity onto the surface of the semiconductor substrate, using the gate electrode as a mask.

(13) A process according to item (12), wherein in the sixth step the heat treatment is carried out at 650° C. or higher, preferably up to 1100° C.

(14) A process according to item (12), wherein the metal silicide layer is a tungsten silicide layer, the metal nitride layer is a tungsten nitride layer and the first and second metallic layers are tungsten layers.

(15) A process for producing a semiconductor device, which comprises a step of forming a first insulation layer on the surface of a semiconductor substrate, a step of depositing a silicon layer on the first insulation layer, a step of depositing a metal silicide layer on the silicon layer, a step of depositing a reaction barrier layer such as a metal nitride layer on the metal silicide layer, a step of depositing a metallic layer on the metal nitride layer, a step of processing the stacked structure comprising the silicon layer, the metal silicide layer, the metal nitride layer and the metallic layer into a gate electrode form, and a step of ion implanting an impurity onto the surface of the semiconductor substrate, using the gate electrode as a mask.

(16) A process according to item (15), wherein the metal silicide layer is a tungsten silicide layer, the metal nitride layer is a tungsten nitride layer and the metallic layer is a tungsten layer.

As mentioned above, the semiconductor device of the present invention is characterized by having a metal/reaction barrier/metal silicide/polycrystalline silicon stacked gate electrode.

The lowest layer is made of polycrystalline silicon which can be doped with an impurity, and stacked thereon a metal silicide layer made of; for example, tungsten silicide, molybdenum silicide, nickel silicide, tantalum silicide, hafnium silicide, zirconium silicide, cobalt silicide, etc., and stacked thereon a reaction barrier layer made of, for example, tungsten nitride, titanium nitride, molybdenum nitride, tantalum nitride, tungsten carbide, titanium carbide, molybdenum carbide, tantalum carbide, etc. The uppermost layer is a metal layer made of, for example, tungsten, molybdenum, etc.

The present invention will be described in detail below, referring to Examples and Drawings.

EXAMPLE 1

FIGS. 1A to 1E are cross-sectional views showing process steps for forming a gate electrode according to Example 1 of the present invention.

Gate insulation layer 102 is formed on the surface of semiconductor substrate 101 e.g., by thermal oxidation, and then polycrystalline silicon layer 103 is deposited thereon e.g. by CVD (FIG. 1A).

Figure 1B:
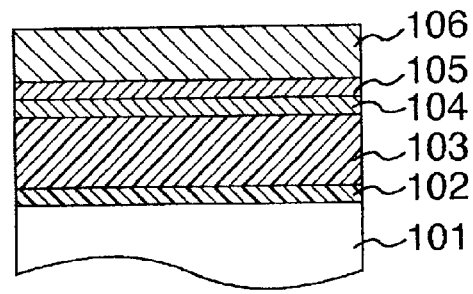

Polycrystalline silicon layer 103 is doped with an impurity of any desired conductivity type (e.g. phosphorus or boron) by ion implanting, followed by activation annealing at 950°–1,000° C. Then, metallic layer 104 of e.g. tungsten is deposited thereon to a thickness of about 5 nm e.g. by sputtering, where precleaning e.g. with hydrofluoric acid is carried out beforehand to remove natural oxide, etc. remaining on the surface of polycrystalline silicon layer 103. Then, metal nitride layer 105 of e.g. tungsten nitride as a reaction barrier and metallic layer 106 of e.g. tungsten are deposited thereon one after the other to a thickness of about 5 to about 10 nm and to a thickness of about 50 nm, respectively, e.g. by sputtering (FIG. 1B).

Figure 1C:
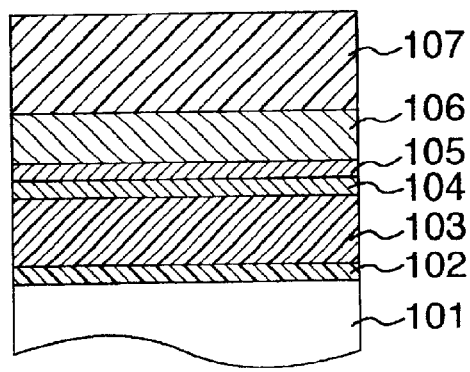

It is desirable to deposit these metallic layers 104 and 106 or metal nitride layer 105 continuously without exposure to the air. Then, silicon oxide layer 107 is deposited on metallic layer 6 e.g. by plasma CVD (FIG. 1C).

Figure 1D:
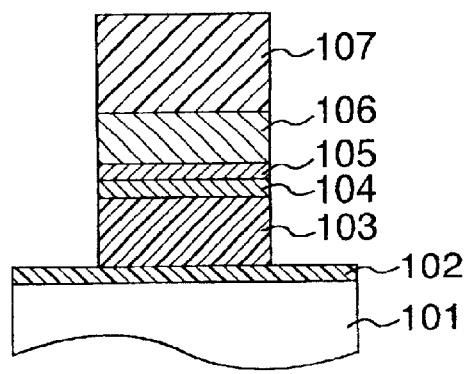
Figure 1E:
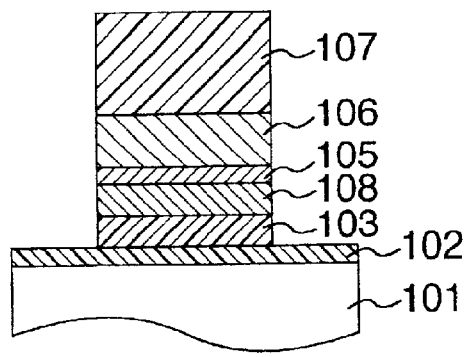

The stacked structure of these deposited layers is processed into a gate electrode e.g. by lithography and anisotropic dry etching, using a resist (FIG. 1D).

Then, metallic layer 104 is made to react with polycrystalline silicon layer 103 by heat treatment at 650° C. or higher in a process for forming a CMOS device, thereby forming metal silicide layer 108 of e.g. tungsten silicide to a thickness about twice as large as that of deposited metallic layer 104.

The gate electrode thus formed has a contact resistance by about 1/10 to about 1/40 lower than that of the conventional gate electrode without insertion of a metal silicide layer, because a desirable metal/semiconductor contact can be formed between metal silicide layer 108 and polycrystalline silicon layer 103 in the present Example.

EXAMPLE 2

FIGS. 2A to 2D are cross-sectional views showing process steps for forming a gate electrode according to Example 2 of the present invention.

Figure 2A:
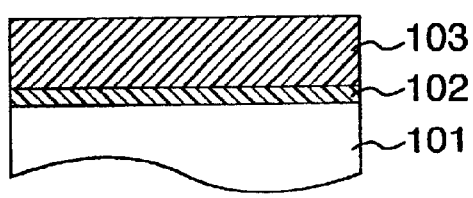
FIGS. 2A to 2D are cross-sectional views showing process steps of Example 2 according to the present invention.
Figure 2B:
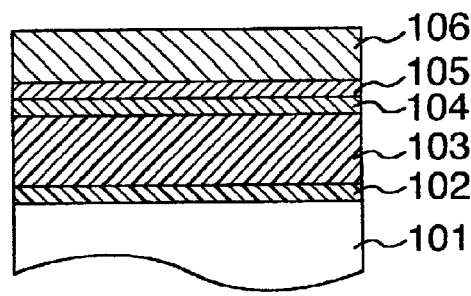
Figure 2C:
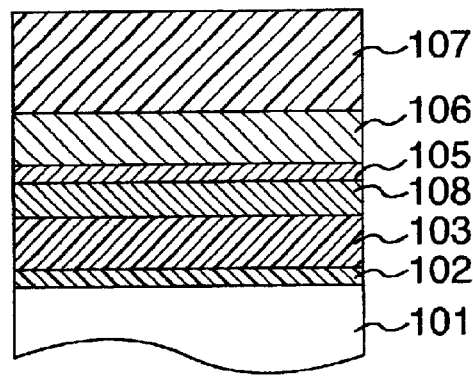

The process steps of FIGS. 2A and 2B are identical with those of FIGS. 1A and 1B of Example 1. After gate insulation layer 102, polycrystalline silicon layer 103, metallic layer 104 of e.g. tungsten, metal nitride layer 105 of e.g. tungsten nitride, and metallic layer 106 of e.g. tungsten have been deposited on silicon substrate 101 as a stacked structure (FIG. 26), heat treatment of the stacked structure is carried out at 650° C. or higher in the present Example to react metallic layer 104 with polycrystalline silicon layer 103, thereby forming metal silicide layer 108 of e.g. tungsten silicide only to a thickness about twice as large as that of deposited metallic layer 104 (FIG. 2C).

Figure 2D:
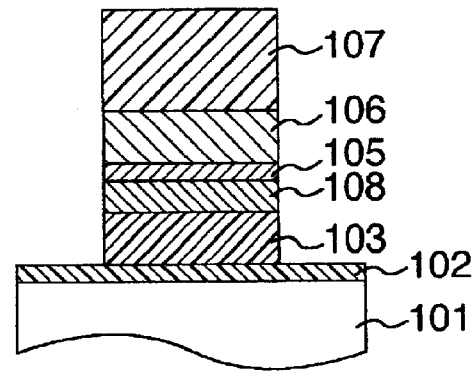

Then, the stacked structure is processed into a gate electrode e.g. by lithography and anisotropic dry etching using a resist (FIG. 2D).

The gate electrode thus formed has a contact resistance by about 1/10 to about 1/40 lower than that of the conventional gate electrode without insertion of a metal silicide layer, because a desirable metal/semiconductor contact can be formed between metal silicide layer 108 and polycrystalline silicon layer 103 in the present Example.

EXAMPLE 3

FIGS. 3A to 3D are cross-sectional views showing process steps for forming a gate electrode according to Example 3 of the present invention.

Figure 3A:
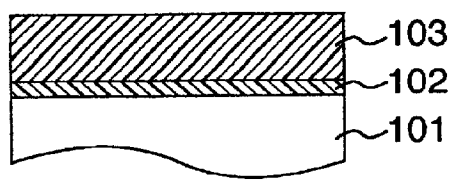
FIGS. 3A to 3D are cross-sectional views showing process steps of Example 3 according to the present invention.

Gate insulation layer 102 is formed on the surface of semiconductor substrate 101 e.g. by thermal oxidation, and then polycrystalline silicon layer 103 is deposited thereon e.g. by CVD (FIG. 3A).

Figure 3B:
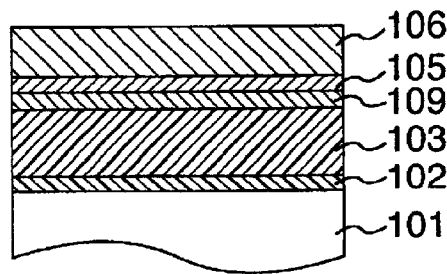

Polycrystalline silicon layer 103 is doped with an impurity of any desired conductivity type (e.g. phosphorus or boron) by ion implanting, followed by activation annealing at 950°–1,000° C. Then, metal silicide layer 109 of e.g. tungsten silicide is deposited thereon to a thickness of 5–20 nm e.g. by sputtering or CVD, where precleaning e.g. with hydrofluoric acid is carried out beforehand to remove natural oxide, etc. remaining on the surface of polycrystalline silicon layer 103. Then, metal nitride layer 105 of e.g. tungsten nitride as a reaction barrier and metallic layer 106 of e.g. tungsten are deposited thereon one after the other to a thickness of about 5 to about 10 nm and to thickness of about 50 nm, respectively, e.g. by sputtering (FIG. 3B).

Figure 3C:
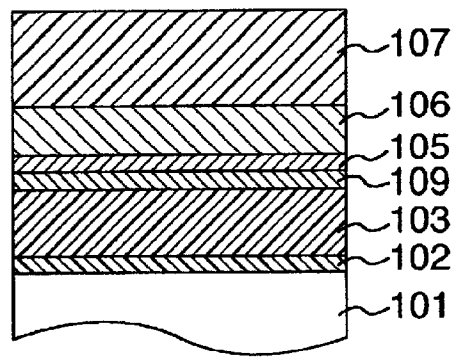

It is desirable to deposit these metal silicide layer 109, metal nitride layer 105 and metallic layer 106 continuously without exposure to the air. Then, silicon oxide layer 107 is deposited on metallic layer 106, e.g. by plasma CVD (FIG. 3C).

Figure 3D:
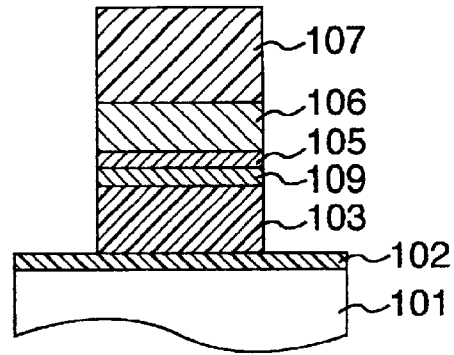

The stacked structure of these deposited layers is processed into a gate electrode, e.g. by lithography and anisotropic dry etching using a resist (FIG. 3D).

The gate electrode thus formed has a contact resistance by about 1/10 to about 1/40 lower than that of the conventional gate electrode without insertion of a metal silicide layer, because a desirable metal/semiconductor contact can be formed between metal silicide layer 109 and polycrystalline silicon layer 103 in the present Example.

EXAMPLE 4

FIGS. 4A to 4C and FIGS. 5A to 5C are cross-sectional views showing process steps for producing CMOS (complementary MOS) transistors according to Example 4 of the present invention.

Figure 4A:
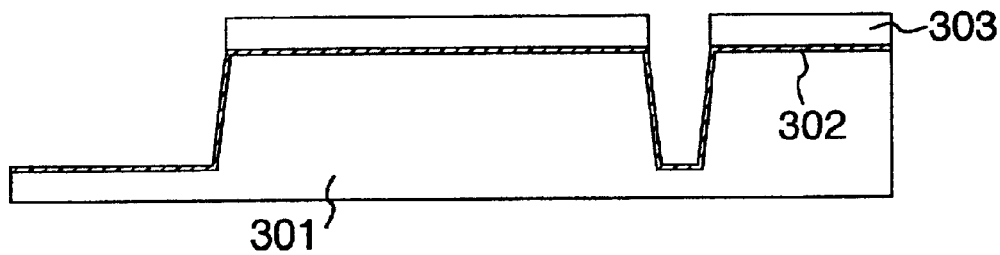
FIGS. 4A to 4C are cross-sectional views showing part of process steps of Example 4 according to the present invention.

The surface of silicon substrate 301 is oxidized to a thickness of about 10 nm e.g. by thermal oxidation to form oxide layer 302, and silicon nitride layer 303 is deposited thereon to a thickness of about 150 nm e.g. by thermal CVD. Then, a trench is formed to a depth of about 0.3 $\mu$m in a region serving as isolation area of silicon substrate 301 by photolithography and dry etching and then the inside surface of the trench is thermally oxidized to a thickness of about 10 nm (FIG. 4A).

Figure 4B:
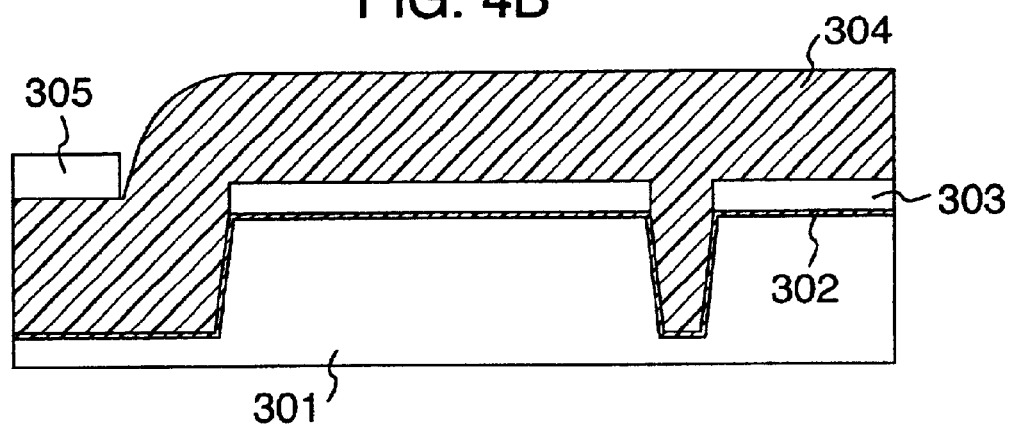
Figure 4C:
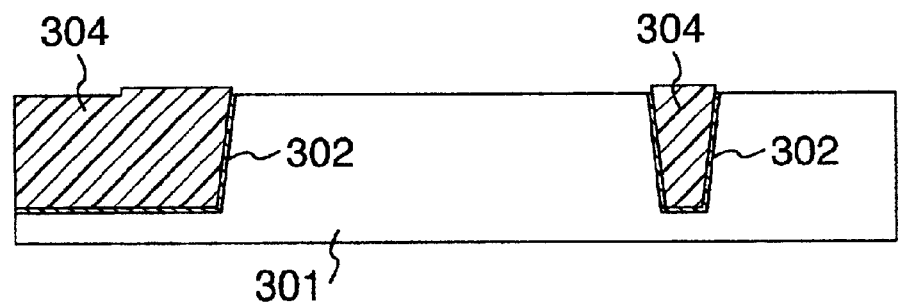

Then, silicon oxide layer 304 is deposited e.g. by CVD to fill the trench, and the silicon nitride layer 305 is deposited thereon e.g. by thermal CVD. Silicon nitride layer 305 is removed only from the surface of device-active region e.g. by photolithography and dry etching, as shown in FIG. 4B, followed by flattening by CMP (Chemical Mechanical Polishing). Polishing rate of silicon nitride layers 303 and 305 is lower than that of silicon oxide layer 304, so that the polishing can be discontinued at the level of silicon nitride layers 303 and 305. Then, silicon nitride layers 303 and 305 and silicon oxide layer 302 are removed by wet cleaning (FIG. 4C).

Then, gate insulation layer 310 is formed on the surface of semiconductor substrate 301 e.g. by thermal oxidation, and polycrystalline silicon layer is formed thereon e.g. by CVD. The polycrystalline silicon layer is locally doped with an impurity of n-type (e.g. phosphorus) and with another impurity of p-type (e.g. boron) by ion implanting, thereby forming n-type polycrystalline silicon layer 311 as an NMOS gate electrode and p-type polycrystalline silicon layer 312 as a PMOS gate electrode, respectively, followed by activation annealing at 950° C. Then, metallic layer 309 of e.g. tungsten is deposited thereon to a thickness of about 5 nm e.g. by sputtering, where precleaning e.g. with hydrofluoric acid is carried out beforehand to remove natural oxide, etc. remaining on the surfaces of polycrystalline silicon layers 311 and 312. Then, metal nitride layer 308 of e.g. tungsten nitride as a reaction barrier and metallic layer 307 of e.g. tungsten are deposited thereon one after the other to a thickness of about 5 to about 10 nm and to a thickness of about 50 nm, respectively, e.g. by sputtering. It is desirable to deposit these metallic layer 309, metal nitride layer 308 and metallic layer 307 continuously without exposing to the air. Then, silicon oxide layer 306 is deposited on metallic layer 307 e.g. by plasma CVD.

The stacked structure of these deposited layers is processed into gate electrodes e.g. by lithography and anisotropic dry etching using a resist.

Figure 5A:
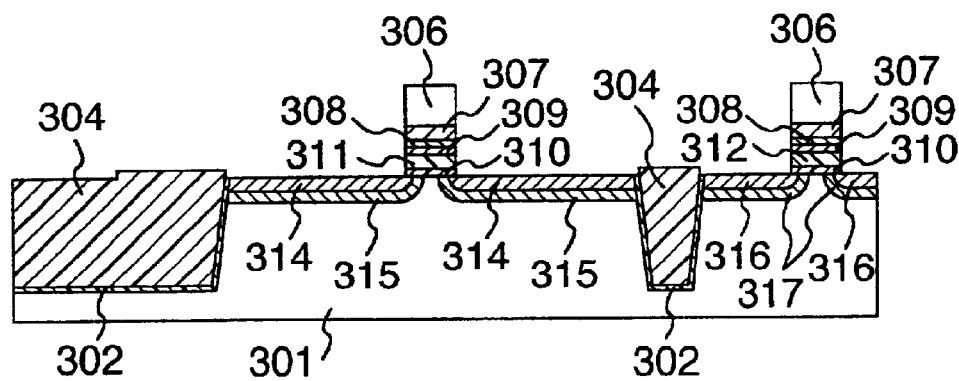
FIGS. 5A to 5C are cross-sectional views showing part of process steps of Example 4 according to the present invention.

Then, NMOS diffusion layer region 314 and punch-through stopper region 315, and PMOS diffusion layer region 316 and punch-through stopper region 317 are formed by photolithography and ion implanting (FIG. 5A).

Figure 5B:
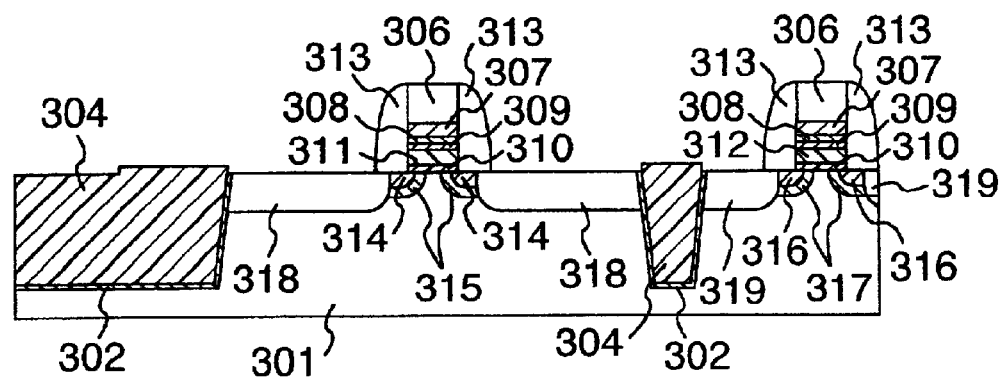

Furthermore, after a silicon oxide layer is deposited thereon e.g. by plasma CVD, side walls 313 of silicon oxide are formed on the gate electrode sides by removing the deposited silicon oxide layer only by a corresponding deposited thickness portion by isotropic dry etching. Then, deeper NMOS and PMOS diffusion layer regions 318 and 319, respectively, are formed by photolithography and ion implanting (FIG. 5B).

Figure 5C:
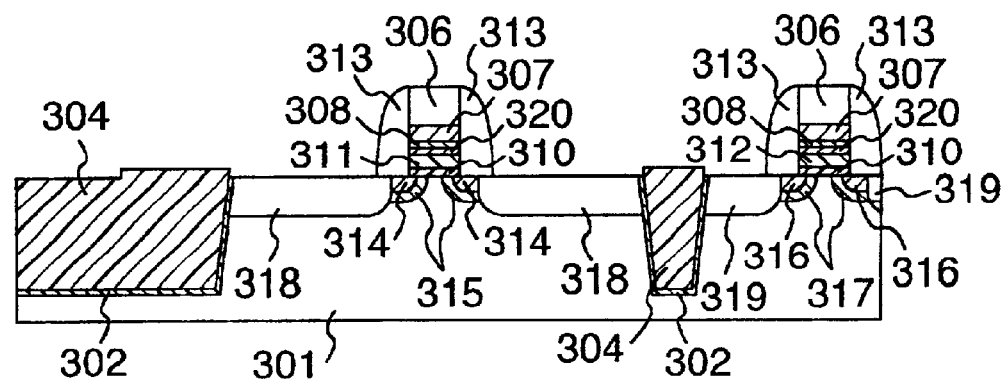

Then, metallic layer 309 is made to react with polycrystalline silicon layers 311 and 312 by activation annealing of transistor [e.g. RTA (Rapid Thermal Annealing) at 950° C. for 10 seconds], thereby forming metal silicide layer 320 of e.g. tungsten silicide to a thickness about, twice as large as that of deposited metallic layer 309 (FIG. 5C).

The gate electrodes thus formed have a contact resistance by about 1/10 to about 1/40 lower than that of the conventional gate electrodes without insertion of a metal silicide layer, because a desirable metal/semiconductor contact can be formed between metal silicide layer 320 and polycrystalline silicon layer 311 or 312 in the present Example. Device circuit performance (propagation delay of CMOS device under no load) can be also increased to about 12 ps from bout 28 ps (CMOS device with gate length generation of 0.10 μm) owing to these effects.

EXAMPLE 5

FIGS. 6A to 6C and FIGS. 7A to 7C are cross-sectional views showing process steps for producing CMOS transistors according to Example 5 of the present invention.

Figure 6A:
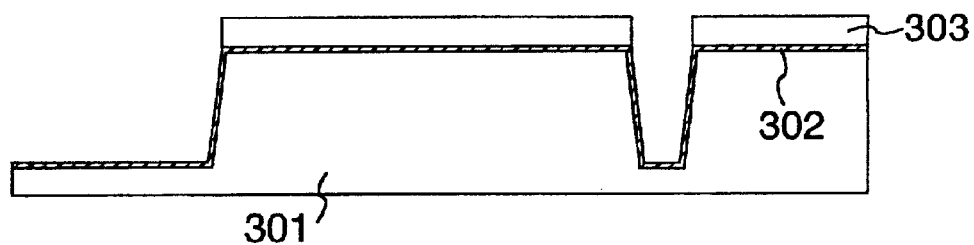
FIGS. 6A to 6C are cross-sectional views showing part of process steps of Example 5 according to the present invention.

The surface of silicon substrate 301 is oxidized to a thickness of about 10 nm e.g. by thermal oxidation to form oxide layer 302, and silicon nitride layer 303 is deposited thereon to a thickness of about 150 nm e.g. by thermal CVD. Then, a trench is formed to a depth of about 0.3 pm in a region serving as isolation area of silicon substrate 301 by photolithography and dry etching and then the inside surface of the trench is thermally oxidized to a thickness of about 10 nm (FIG. 6A).

Figure 6B:
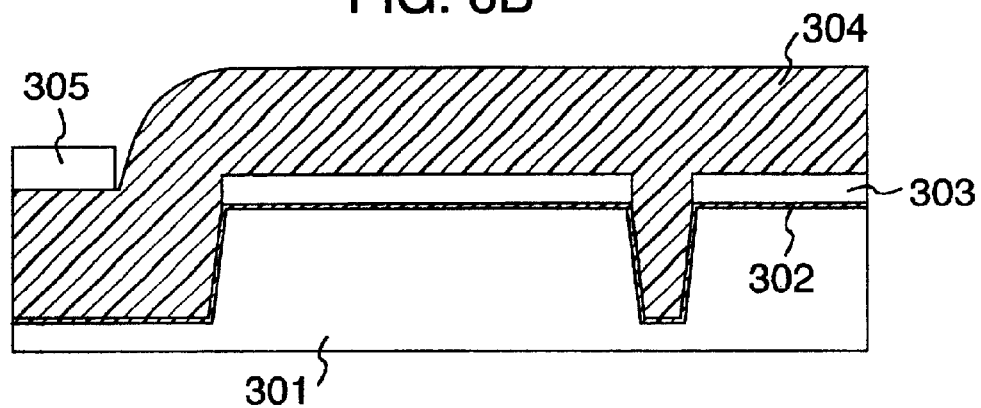
Figure 6C:
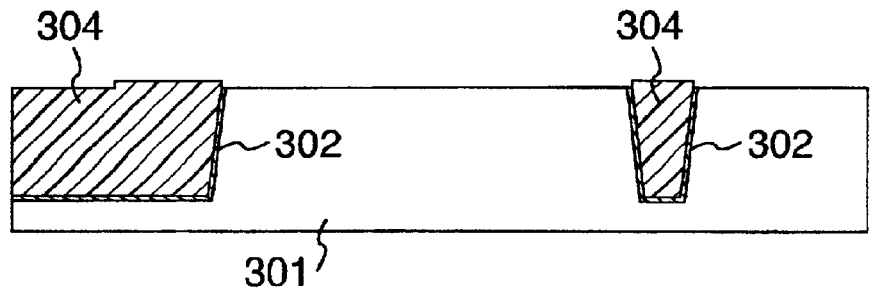

Then, silicon oxide layer 304 is deposited e.g. by CVD to fill the trench and then silicon nitride layer 305 is deposited thereon e.g. by thermal CVD. Silicon nitride layer 305 is removed only from the surface of device-active region e.g. by photolithography and dry etching as shown in FIG. 6B, followed by flattening by CMP (Chemical Mechanical Polishing). Polishing rate of silicon nitride layer 303 and 305 is lower than that of silicon oxide layer 304, so that the polishing can be discontinued at the level of silicon nitride layers 303 and 305. Then, silicon nitride layers 303 and 305 and silicon oxide layers 302 are removed by wet cleaning (FIG. 6C).

Figure 7A:
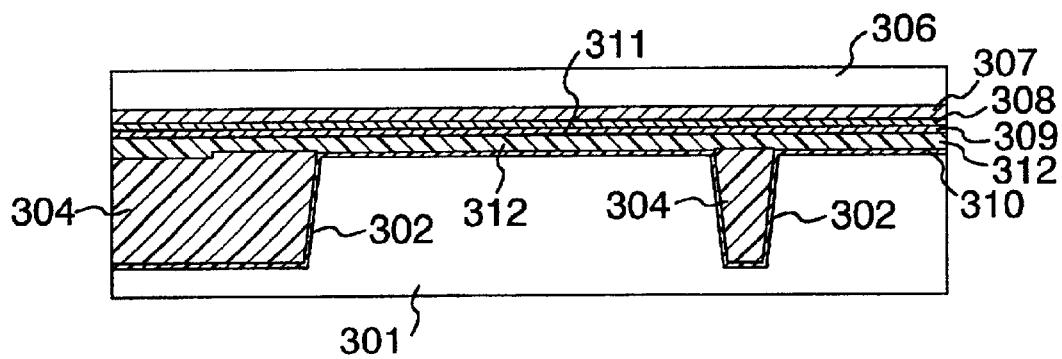
FIGS. 7A to 7C are cross-sectional views showing part of process steps of Example 5 according to the present invention.

Then, gate insulation layer 310 is formed on the surface of semiconductor substrate 301 e.g. by thermal oxidation, and polycrystalline silicon layer is formed thereon e.g. by CVD. The polycrystalline silicon layer is locally doped with an impurity of n-type (e.g. phosphorus) and with another impurity of p-type (e.g. boron) by ion implanting, thereby forming n-type polycrystalline silicon layer 311 as an NMOS gate electrode and p-type polycrystalline silicon layer 312 as a PMOS gate electrode, respectively, followed by activation annealing at 950° C. Then, metallic layer 309 of e.g. tungsten is deposited thereon to a thickness of about 5 nm e.g. by sputtering, where precleaning e.g. with hydrofluoric acid is carried out beforehand to remove natural oxide, etc. remaining on the surfaces of polycrystalline silicon layers 311 and 312. Then, metal nitride layer 308 of e.g. tungsten nitride as a reaction barrier and metallic layer 307 of e.g. tungsten are deposited thereon one after the other to a thickness of about 5 to about 10 nm and to a thickness of about 50 nm, respectively, e.g. by sputtering. It is desirable to deposit these metallic layer 309, metal nitride layer 308 and metallic layer 307 continuously without exposing to the air. Then, silicon oxide layer 306 is deposited on metallic layer 307 e.g. by plasma CVD (FIG. 7A).

Figure 7B:
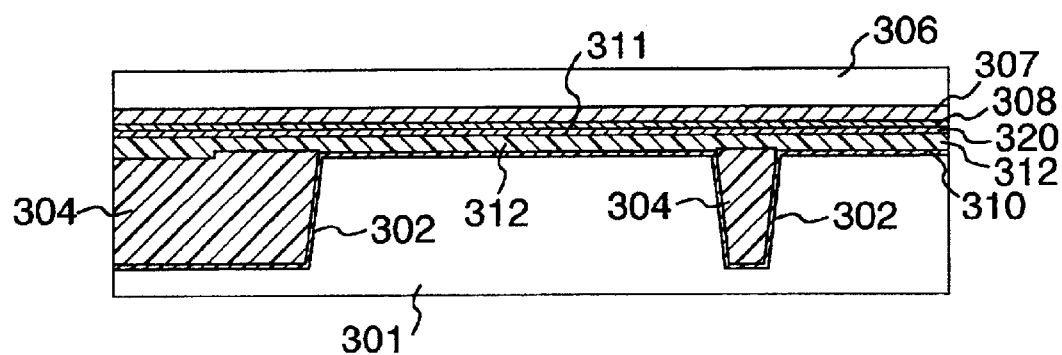

In the present Example, heat treatment is carried out at 650° C. or higher at this stage to make metallic layer 309 react with polycrystalline silicon layers 311 and 312, thereby forming metal silicide layer 320 of e.g. tungsten silicide to a thickness about twice as large as that of deposited metallic layer 309 (FIG. 7B).

The stacked structure of these deposited layers is processed into gate electrodes e.g. by lithography and anisotropic dry etching using a resist.

Figure 7C:
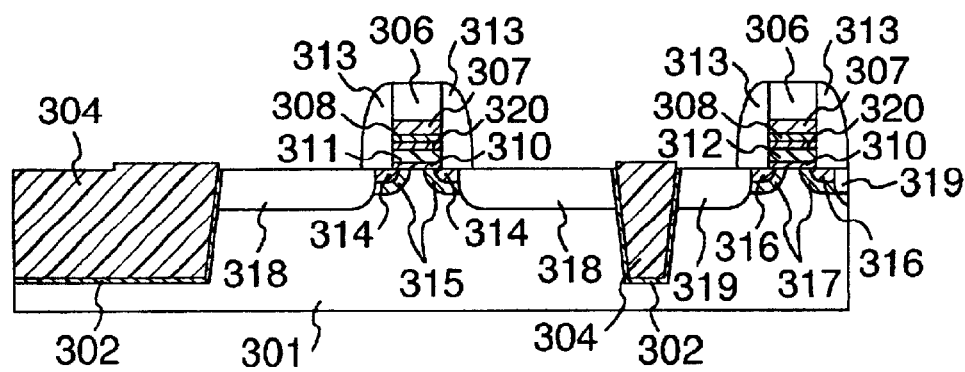

Then, NMOS diffusion layer region 314 and punch-through stopper region 315, and PMOS diffusion layer region 316 and punch-through stopper region 317 are formed by photolithography and ion implanting. Furthermore, after a silicon oxide layer is deposited thereon e.g. by plasma CVD, side walls 313 of silicon oxide are formed on the gate electrode sides by removing the deposited silicon oxide layer only by a corresponding deposited thickness portion by isotropic dry etching. Then, deeper NMOS diffusion layer region 318 and deeper PMOS diffusion layer region 319 are formed by photolithography and ion implanting (FIG. 7C).

The gate electrodes thus formed have a contact resistance by about 1/10 to about 1/40 lower than that of the conventional gate electrodes without insertion of a metal silicide, because a desirable metal/semiconductor contact can be formed between metal silicide layer 320 and polycrystalline silicon layer 311 or 312 in the present Example. Device circuit performance (propagation delay of CMOS device under no load) can be also increased to about 12 ps from about 28 ps (CMOS device with gate length generation of 0.10 pm) owing to these effects.

Contact resistance at the conventional tungsten nitride/polycrystalline silicon boundary is in the order of $10^{-5}$ $\Omega cm^2$ irrespective of whether the polycrystalline silicon is of n- or p-type conductivity, thereby failing to achieve a metal/semiconductor boundary with desirable ohmic characteristics. The present invention, however, can provide a substantially desirable metal/semiconductor boundary by making a tungsten nitride/tungsten silicide/polycrystalline silicon-stacked structure, i.e. can provide a low contact resistance boundary capable of realizing desirable ohmic characteristics. When the present stacked structure is used in the MOS transistor gate electrode, circuit performance can be increased owing to the gate resistance-reducing effect of the present invention.

What is claimed is:

1. A semiconductor device with an MOS transistor, wherein a gate electrode of the MOS transistor is provided as a stacked structure comprising a silicon layer, a metal silicide layer, a metal nitride layer and a metallic layer, formed in that order beginning with the silicon layer, wherein the metal silicide layer and the metal nitride layer are formed as individual layers to function as a contact resistance reducing layer and as a reaction barrier layer, respectively, and wherein said metal silicide layer has a thickness of 5 to 20 nm.

2. A semiconductor device according to claim 1, wherein the silicon layer is doped with an impurity of any desired conductivity type.

3. A semiconductor device according to claim 1, wherein the metal silicide layer is a tungsten silicide layer, the metal nitride layer is a tungsten nitride layer, and the metallic layer is a tungsten layer.

4. A semiconductor device according to claim 3, wherein the silicon layer is a polycrystalline silicon layer doped with an impurity of n-type or p-type conductivity.

5. A semiconductor device according to claim 1, wherein the silicon layer is a polycrystalline silicon layer doped with an impurity of n-type or p-type conductivity.

6. A semiconductor device according to claim 1, wherein the gate electrode is provided above a principal surface region of a semiconductor substrate, covering the spacing between a source region and drain region of the MOS transistor, the source and drain regions each having a first diffusion layer and a second diffusion layer, the second diffusion layer having a junction depth extended into the substrate deeper than that of the first layer.

7. A semiconductor device according to claim 6, wherein the silicon layer is a polycrystalline silicon layer doped with an impurity of n-type or p-type conductivity.

8. A semiconductor device with an MOS transistor whose gate electrode is provided as a stacked structure comprising a silicon layer and a metallic layer as the uppermost layer thereof, wherein a metal silicide layer is provided on the silicon layer side and a metal nitride layer is provided under the metallic layer side between the silicon layer and the metallic layer, wherein the metal silicide layer and the metal nitride layer are formed as individual layers to function as a contact resistance reducing layer and as a reaction barrier layer, respectively, and wherein said metal silicide layer has a thickness of 5 to 20 nm.

9. A semiconductor device according to claim 8, wherein the silicon layer is doped with an impurity of any desired conductivity type.

10. A semiconductor device according to claim 8, wherein the metal silicide layer is a tungsten silicide layer, the metal nitride layer is a tungsten nitride layer and the metallic layer is a tungsten layer.

11. A semiconductor device according to claim 10, wherein the silicon layer is a polycrystalline silicon layer doped with an impurity of n-type or p-type conductivity.

12. A semiconductor device according to claim 8, wherein the silicon layer is a polycrystalline silicon layer doped with an impurity of n-type or p-type conductivity.

13. A semiconductor device with complementary MOS transistors, each MOS transistor having a gate electrode, a source region and a drain region, wherein the gate electrode is provided as a stacked structure comprising a silicon layer, a metal silicide layer, a metal nitride layer and a metallic layer, formed in that order beginning with the silicon layer, wherein the metal silicide layer and the metal nitride layer are formed as individual layers to function as a contact resistance reducing layer and as a reaction barrier layer, respectively, and wherein said metal silicide layer has a thickness of 5 to 20 nm.

14. A semiconductor device according to claim 13, wherein the silicon layer of each MOS transistor gate electrode is a polycrystalline silicon layer doped with an impurity of one of an n-type and p-type conductivity for the gate electrode of a n-channel type MOS transistor and doped with an impurity of the other one of the n-type and p-type conductivity for the gate electrode of a p-channel type MOS transistor.

15. A semiconductor device according to claim 13, wherein the metal silicide layer is a tungsten silicide layer, the metal nitride layer is a tungsten nitride layer, and the metallic layer is a tungsten layer.

16. A semiconductor device with complementary MOS transistors, each MOS transistor having a gate electrode, a source region and a drain region, wherein the gate electrode is provided as a stacked structure comprising a silicon layer, an uppermost metallic layer, a metal silicide layer provided on the silicon layer side and a metal nitride layer provided under the metallic layer side between the silicon layer and the metallic layer, wherein the metal silicide layer and the metal nitride layer are formed as individual layers to function as a contact resistance reducing layer and as a reaction barrier layer, respectively, and wherein said metal silicide layer has a thickness of 5 to 20 nm.

17. A semiconductor device according to claim 16, wherein the silicon layer of each MOS transistor gate electrode is a polycrystalline silicon layer doped with an impurity of one of an n-type and p-type conductivity for the gate electrode of a n-channel type MOS transistor and doped with an impurity of the other one of the n-type and p-type conductivity for the gate electrode of a p-channel type MOS transistor.

18. A semiconductor device according to claim 16, wherein the metal silicide layer is a tungsten silicide layer, the metal nitride layer is a tungsten nitride layer, and the metallic layer is a tungsten layer.

19. A semiconductor device comprising, on a substrate, at least one MOS transistor, wherein a gate electrode of the MOS transistor is provided as a stacked structure comprising a silicon layer, a metal silicide layer, a metal nitride layer and a metallic layer, formed in that order beginning with the silicon layer, wherein the metal silicide layer and the metal nitride layer are formed as individual layers to function as a contact resistance reducing layer and as a reaction barrier layer, respectively, and wherein said metal silicide layer has a thickness of 5 to 20 nm.

20. A semiconductor device according to claim 19, wherein the silicon layer is a polycrystalline silicon layer doped with an impurity of n-type or p-type conductivity.

21. A semiconductor device according to claim 19, wherein said substrate includes a semiconductor substrate.

22. A semiconductor device according to claim 19, wherein the gate electrode is provided above a principal surface region of a semiconductor substrate, covering the spacing between a source region and drain region of the MOS transistor, the source and drain regions each having a first diffusion layer and a second diffusion layer, the second diffusion layer having a junction depth extended into the substrate deeper than that of the first layer.

23. A semiconductor device according to claim 22, wherein the silicon layer is a polycrystalline silicon layer doped with an impurity of n-type or p-type conductivity.

24. A semiconductor device according to claim 22, wherein said substrate includes a semiconductor substrate.

* * * * *